(12) United States Patent
Chu et al.

US006397618B1

(10) Patent No.: US 6,397,618 B1
(45) Date of Patent: Jun. 4, 2002

(54) COOLING SYSTEM WITH AUXILIARY THERMAL BUFFER UNIT FOR COOLING AN ELECTRONICS MODULE

(75) Inventors: Richard C. Chu, Poughkeepsie; Michael J. Ellsworth, Jr., Lagrangeville; Robert E. Simons, Poughkeepsie, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/867,855

(22) Filed: May 30, 2001

(51) Int. Cl.[7] ............................................... F25B 23/00
(52) U.S. Cl. ................................. 62/259.2; 165/104.22
(58) Field of Search ........................... 62/259.2, 259.3, 62/457.9, 457.2, 119; 165/80.2, 104.22; 361/689, 699

(56) References Cited

U.S. PATENT DOCUMENTS

| | | | |
|---|---|---|---|
| 5,007,478 A | | 4/1991 | Sengupta ..................... 165/10 |
| 5,220,809 A | * | 6/1993 | Voss ........................... 62/259.2 |
| 5,455,458 A | * | 10/1995 | Quon et al. .................. 257/714 |
| 5,553,629 A | | 9/1996 | Kiepert et al. ............... 128/869 |
| 5,896,922 A | | 4/1999 | Chrysler et al. ............. 165/165 |
| 5,934,364 A | | 8/1999 | Chrysler et al. ............. 165/170 |
| 5,954,127 A | | 9/1999 | Chrysler et al. ............. 165/170 |
| 5,966,957 A | * | 10/1999 | Malhammar et al. ....... 62/259.2 |
| 5,970,731 A | | 10/1999 | Hare et al. ................... 62/196.4 |
| 6,034,872 A | | 3/2000 | Chrysler et al. ............. 361/699 |
| 6,035,655 A | | 3/2000 | Hare et al. ................... 62/259.2 |
| 6,052,285 A | * | 4/2000 | Hileman ....................... 361/699 |
| 6,097,602 A | | 8/2000 | Witchger ..................... 361/705 |
| 6,205,803 B1 | * | 3/2001 | Scaringe ..................... 62/259.2 |
| 6,213,194 B1 | | 4/2001 | Chrysler et al. ............. 165/80.3 |
| 6,307,871 B1 | * | 10/2001 | Heberie ........................ 372/34 |
| 6,319,599 B1 | * | 11/2001 | Buckley .................... 428/308.4 |

FOREIGN PATENT DOCUMENTS

WO    WO 00/08536    2/2000 .......... G05D/23/01

OTHER PUBLICATIONS

Chu et al., pending U.S. patent application Serial No. 09/726,909, filed Nov. 30, 2000, entitled "Electronic Module With Integrated Programmable Thermoelectric Cooling Assembly and Method of Fabrication".
Chu et al., pending U.S. patent application Serial No. 09/726,900, filed Nov. 30, 2000, entitled "Electronic Module With Integrated Thermoelectric Cooling Assembly".

* cited by examiner

*Primary Examiner*—William Doerrler
*Assistant Examiner*—Melvin Jones
(74) *Attorney, Agent, or Firm*—Andrew J. Wojnicki, Jr., Esq.; Kevin P. Radigan, Esq.; Heslin Rothenberg Farley & Mesiti P.C.

(57) ABSTRACT

A cooling system and method of fabrication are provided for cooling an electronics device. The cooling system includes a cooling unit and an evaporator plate having at least one isolated refrigerant loop therein for receiving coolant from the cooling unit. A thermal buffer unit having a phase change material therein is thermally coupled to the evaporator plate to maintain temperature of the evaporator plate within a predefined range for a period of time upon failure or shut down of the cooling unit. A thermal conductor structure, such as a metal foam structure and/or thermal transfer rods, is disposed within the thermal buffer unit to facilitate heat transfer between the phase change material and the evaporator plate.

21 Claims, 8 Drawing Sheets

COOLING SYSTEM WITH AUXILIARY THERMAL BUFFER UNIT FOR COOLING AN ELECTRONICS MODULE

CROSS-REFERENCE TO RELATED PATENTS/APPLICATIONS

This application contains subject matter which relates to the subject matter of the following commonly-owned patents and applications, each of which is hereby incorporated herein by reference in its entirety:

"Hybrid Cooling System For Electronics Module", by Chrysler et al., U.S. Pat. No. 6,213,194, issued Apr. 10, 2001;

"Modular Refrigeration System", by Hare et al., U.S. Pat. No. 6,035,655, issued Mar. 14, 2000;

"Cooling Computer Systems", by Chrysler et al., U.S. Pat. No. 6,034,872, issued Mar. 7, 2000;

"Modular Refrigeration System", by Hare et al., U.S. Pat. No. 5,970,731, issued Oct. 26, 1999;

"Cold Plate For Dual Refrigeration System", by Chrysler et al., U.S. Pat. No. 5,954,127, issued Sep. 21, 1999;

"Cold Plate For Dual Refrigeration Systems", by Chrysler et al., U.S. Pat. No. 5,934,364, issued Aug. 10, 1999;

"Cold Plate For Dual Refrigeration Systems", by Chrysler et al., U.S. Pat. No. 5,896,922, issued Apr. 27, 1999;

"Electronic Module With Integrated Programmable Thermoelectric Cooling Assembly and Method of Fabrication", by Chu et al., U.S. Ser. No. 09/726,909, filed Nov. 30, 2000; and "Electronic Module With Integrated Thermoelectric Cooling Assembly", by Chu et al., U.S. Ser. No. 09/726,900, filed Nov. 30, 2000.

TECHNICAL FIELD

The present invention is generally directed to providing reliable cooling systems for mainframe computer systems or for any electronics system requiring cooling. More particularly, the present invention is directed to an auxiliary thermal buffer unit employed with a primary cooling system or with redundant cooling systems to cool an electronics device such as an electronics module.

BACKGROUND OF THE INVENTION

In recent years, the semiconductor industry has taken advantage of the fact that CMOS circuits dissipate less power than bipolar circuits. This has permitted more dense packaging and correspondingly faster CMOS circuits. However, almost no matter how fast one wishes to run a given electronics circuit chip, there is always the possibility of running it faster if the chip is cooled and thermal energy is removed from it during its operation. This is particularly true of computer processor circuit chips and even more true of these chips when they are disposed within multichip modules (MCMs), which generate significant amounts of heat. Because there is a great demand to run these processor modules at higher speeds, the corresponding clock frequencies at which these devices must operate become higher. In this regard, it should be noted that it is known that power generation rises as a function of the square of the clock frequency. Accordingly, it is seen that the desire for faster computers generates not only demand for computer systems but also generates thermal demands in terms of energy which must be removed for faster, safer and more reliable circuit operation. In this regard, it is to be particularly noted that, in the long run, thermal energy is the single biggest impediment to semiconductor operation integrity.

In addition to the demand for higher and higher processor speeds, there is also a concomitant demand for reliable computer systems. This means that users are increasingly unwilling to accept down time as a fact of life. This is particularly true in the mainframe and server realms when zero down time and minimum maintenance requirements are typical goals. There are yet other requirements that must be met when designing cooling units for computer systems, especially those which operate continuously and which may in fact be present in a variety of different thermal environments. For example, the cooling system should be designed, controlled and set up so that various failure modalities do not bring the entire computer system down nor risk damage to the components within the system. All of these requirements must be considered in providing a cooling system for a computer system, particularly for a mainframe and/or server system.

SUMMARY OF THE INVENTION

To briefly summarize, the present invention comprises in one aspect a cooling system, e.g., for an electronics module. The cooling system includes a cooling unit, and an evaporator plate having at least one isolated refrigerant loop therein for receiving coolant from the cooling unit. The system further includes a thermal buffer, which is thermally coupled to the evaporator plate and which maintains temperature of the evaporator plate within a predefined range for a period of time upon shut down or failure of the cooling unit.

In another aspect, the invention comprises a cooled processing stack. The cooled processing stack includes an electronics module having a main surface to which a cooling system is thermally coupled. The cooling system includes a cooling unit and an evaporator plate having at least one isolated refrigerant loop therein for receiving coolant from the cooling unit. In addition, the cooling system includes a thermal buffer which is thermally coupled to the evaporator plate to maintain temperature of the evaporator plate within a predefined range for a period of time upon shut down or failure of the cooling unit.

In a further aspect, the invention comprises a method of fabricating a cooling system for an electronics module. The method includes providing a refrigeration cooled cold plate, and thermally coupling the thermal buffer unit to the cold plate. The refrigeration cooled cold plate is thermally coupled to the electronics module for removing heat generated by the module. When in operation, the thermal buffer unit is thermally coupled to the electronics module across the refrigeration cooled cold plate for auxiliary cooling of the module upon shut down or failure of the refrigeration cooled cold plate.

Accordingly, it is an object of the present invention to provide a system and method for cooling computer and other electronics systems.

It is another object of the present invention to provide a cooling system which possesses redundancy for the purpose of providing uninterrupted use of electronics equipment.

It is a still further object of the present invention to provide a cooling system for electronics assemblies, modules and cards.

It is also an object of the present invention to provide a cooling system for electronics components which include fail-safe means for operation in the event of a number of different failure modalities, including refrigerant leakage.

It is also an object of the present invention to provide a system and method for continued computer usage in the event of cooling system problems.

It is a still further object of the present invention to provide a cold plate for electronics component cooling which preserves refrigerant flow isolation while at the same time maintaining good thermal connectivity to a module to be cooled and also provides good thermal conduction and flow-wise isolation between dual refrigerant loops.

It is a still further object of the present invention to provide an electronics component cooling system which is self-contained.

It is also an object of the present invention to provide a computer or electronics system in which the refrigerant cooling system is a rack-mountable, field-replaceable unit.

It is also an object of the present invention to provide a cooling system for an electronics module which can be attached to a refrigeration system by means of flexible and detachable refrigerant supply lines.

It is yet another object of the present invention to provide a refrigeration unit which is capable of operating continuously.

It is still another object of the present invention to provide a refrigeration unit which is capable of variable heat removal capacity, particularly in response to varying thermal demands.

It is a still further object of the present invention to provide a refrigeration unit which is easily startable, easily shut down and is capable of running under low thermal load situations.

It is also an object of the present invention to provide a refrigeration system which is capable of operating in a wide range of ambient and thermal load conditions.

It is still another object of the present invention to provide a hybrid auxiliary cooling system for an electronics module which combines a refrigeration cooled cold plate and an auxiliary thermal buffer unit.

It is a still further object of the present invention to provide a hybrid auxiliary cooling system which provides for continued cooling of an electronics component for a period of time notwithstanding inoperability of a refrigeration cooled cold plate coupled to the electronics module.

It is also an object of the present invention to provide for enhanced ambient cooling of a computer system commensurate with cooling of an electronics module of the computer system.

It is yet another object of the present invention to provide a hybrid auxiliary cooling system having a refrigerant cooled cold plate coupled to either a standard chiller unit supplying chilled water to the cold plate or an evaporation refrigerator supplying a refrigerant to the cold plate.

Lastly, but not limited hereto, it is an object of the present invention to provide a system and method for facilitating the operation of computer systems at higher speeds and, in particularly, for doing so in a reliable manner so as to be able to maintain such systems in continuous operation for as long a time as is reasonably possible.

Additional features and advantages are realized through the techniques of the present invention. Other embodiments and aspects of the invention are described in detail herein and are considered a part of the claimed invention.

BRIEF DESCRIPTION OF THE DRAWINGS

The subject matter which is regarded as the invention is particularly pointed out and distinctly claimed in the concluding portion of the specification. The invention, however, both as to organization and method of practice, together with the further objects and advantages thereof, may best be understood by reference to the following description taken in connection with the accompanying drawings in which:

BEST MODE FOR CARRYING OUT THE INVENTION

Figures 1A, 1B:
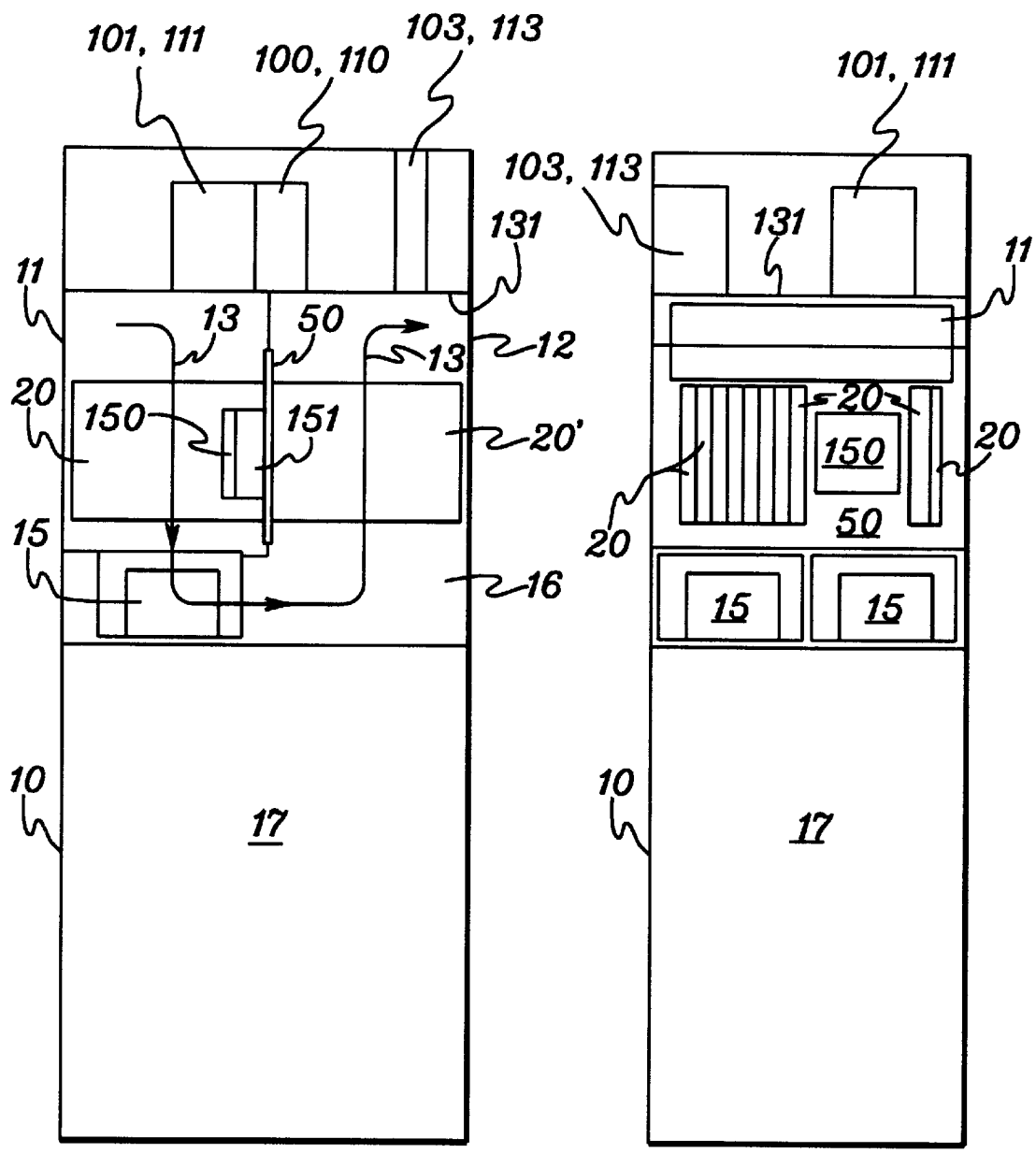
FIG. 1A is a side elevational view illustrating an arrangement of components in accordance with one embodiment of the present invention.
FIG. 1B is a view similar to FIG. 1A but more particularly illustrating a front view.

FIG. 1A illustrates a side view of one embodiment of one aspect of the present invention. This embodiment employs cabinet 10 having inlet opening 11 and outlet opening 12 for the passage of air therethrough. The flow of air is induced by means of one or more blowers 15. Fans or other air-moving devices could also be employed for this same purpose. However, blowers are preferred because of their efficiency. In the apparatus shown in FIG. 1A, air moves from inlet 11 in cabinet 10 to exhaust 12 along air flow line 13. The flow of air is employed for the particular purpose of cooling certain of the electronics components disposed on printed circuit cards or so-called "books" 20. Air flows down between these books or cards through blower(s) 15 to plenum 16 and thence through cards 20' on the other side of mother board 50 into which books 20 are inserted. Thus, having flowed past cards 20 and 20', air stream 13 exits through exhaust 12 in cabinet 10.

The description provided thus far is therefore seen to disclose a primary method for cooling certain ones of the electronics components, namely, those components located on cards 20 and 20' which are of sufficiently low power that air cooling is an appropriate modality. However, an aspect of the present invention is directed to the specific means and systems employed for cooling, e.g., an electronics module 151. In certain embodiments of the present invention, module 151 includes circuits for data components associated with a mainframe or server computer system.

In particular, the system shown in FIGS. 1A and 1B illustrates the placement of cold plate 150 which forms an aspect of one embodiment of the present invention. Cold plate 150 is connected by means of flexible refrigerant lines (not shown for clarity) to a refrigeration system present in the upper portion of cabinet 10 above shelf 131. The refrigeration system for cooling cold plate 150 and, thus, module 151 includes items such as motors, compressors and condensers together with an expansion device. Thus, the system shown in FIGS. 1A and 1B represents an apparatus in which both air cooling and direct refrigerant cooling is employed. It is particularly useful for a proper understanding to note that electronics chip module 151 is not mounted in a sideways fashion as are cards 20 primarily because of the fact that module 151 typically possesses a very large number of pins for achieving connection and communication with other circuits in the computer and/or with other computer systems. Thus, the I/O (input/output) pin requirements for module 151 dictate that it preferably be mounted in the fashion shown. In FIG. 1B, this electronics module is shown disposed beneath cold plate 150 which is visible in FIG. 1B.

As shown in the figures, area 17 may include the same components as shown in the top half of the cabinet. Additionally, area 17 may also include power supply (a power cage, e.g.) along with its own air-moving device. However the components disposed in area 17 are not otherwise relevant to the present invention.

Figure 2:
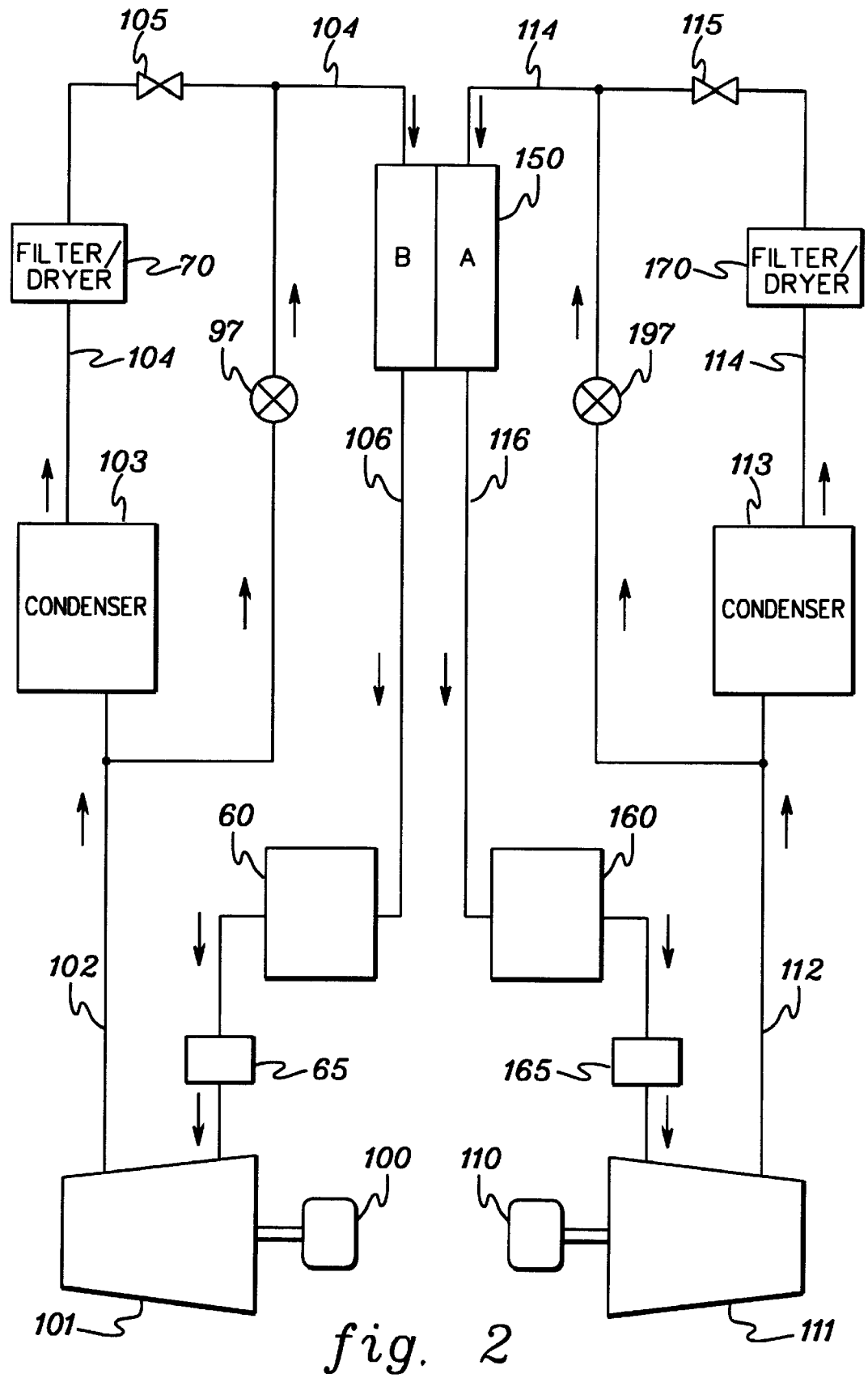
FIG. 2 is a block diagram illustrating a dual redundant refrigeration system for utilization with a cold plate in accordance with the present invention.

In order to provide a desired degree of system cooling redundancy, a dual refrigeration system, such as that shown in FIG. 2, may be provided in accordance with certain embodiments of the present invention. The heart of this dual refrigeration system is the inclusion of cold plate 150 which has contained therein isolated coolant passages for a first refrigerant loop (circuit A) and a second refrigerant loop (circuit B). The cold plate itself may be constructed in several different ways. The cold plate and its construction are more particularly described in the above-incorporated U.S. Letters patent One feature of cold plate 150 is that the coolant passages contained therein are isolated from one another in a flow-wise fashion. That is, cold plate 150 is designed so as to prevent leakage or seepage from one refrigerant loop (circuit A) to the other refrigerant loop (circuit B). In spite of the flow-wise isolation, the two coolant loops provided are, nonetheless, in intimate thermal contact with one another and with the body of the cold plate so as to remove heat from module 151 in an efficient manner.

Thus, in accordance with the redundancy aspect of the present invention, FIG. 2 illustrates a refrigerant system for circuit A and a refrigerant system for circuit B. In particular, motor 100 drives compressor 101 which is connected to condenser 103 by means of supply line 102. Likewise, condenser 103 is connected to circuit B for cold plate 150 by means of supply line 104 which passes through filter/dryer 70 which functions to trap particulate matter present in the refrigerant stream and also to remove any water which might have become entrained in the refrigerant flow. Subsequent to filter/dryer 70, refrigerant flow passes through expansion device 105. Expansion device 105 is preferably an expansion valve. However, it may also comprise a capillary tube or thermostatic valve. Thus, expanded and cooled refrigerant is supplied to circuit B in cold plate 150.

Subsequent to its picking up heat from module 151 through the body of cold plate 150, the refrigerant is returned via return line 106 to accumulator 60 which operates to prevent liquid from entering compressor 101. Accumulator 60 is also aided in its function by the inclusion of smaller capacity accumulator 65 which is included in certain embodiments of the present invention to provide an extra degree of protection against the entry of liquid phase refrigerant into compressor 101. Subsequent to accumulator 65, vapor phase refrigerant is returned to compressor 101 where the cycle repeats. In addition, circuit A is provided with hot gas bypass value (HGBV) 97 which, as its name suggests, operates to pass hot refrigerant gasses from compressor 101 directly to cold plate 150. HGBV 97 is controllable in response to the temperature of cold plate 150 which is provided by module sensor 185 which is preferably a thermistor device affixed to cold plate 150 at any convenient location. In preferred embodiments, HGBV 97 (and other HGBVs discussed herein) are electronically controlled. The HGBVs preferably employed herein are continuously throttleable but are currently operated in fully open and fully closed modes for convenience of design. The HGBVs operate to shunt hot gasses directly to cold plate 150 when its temperature is already sufficiently low. In particular, under these low temperature conditions, motor 100 runs at a lower speed in response to the reduced thermal load. At these lower speeds and loads, there is the danger of motor 101 stalling. Upon detection of such a condition, HGBV 97 is opened in response to a signal supplied to it from microprocessor control 195 (see FIG. 3).

In an analogous fashion, refrigerant flows in the loop in circuit A which includes compressor 111, line 112, condenser 113, filter/dryer 170, expansion device 115, cold plate 150, and return line 116 which connects to accumulator 160, which in turn connects (side A) to smaller accumulator 165 and thence back to compressor 111 which is driven by motor 110. As in circuit B, circuit A also includes HGBV 197, as shown.

The system shown in FIG. 2 lends itself to operation in several different modes. For example, it is possible to design each of the two separate refrigeration systems so that each one is capable of removing all of the desired heat generated by electronics module 151. If such is the case, it is not necessary to run both refrigeration systems at the same time. Nonetheless, because of the desirability of maintaining seals in a wetted or moistened state, it may not be desirable to shut off either one of the two refrigeration systems for extended periods of time. Thus, in the circumstance where either refrigeration system is capable of providing the desired cooling, it is desired to control these systems in a manner so that as one is being shut down, the other is being turned on and being brought up to speed so that the other system may "rest". In certain methods of operation, the separate refrigeration systems can be each run for about 24 hours, at which time the other system is brought online and the first system is shortly thereafter shut down.

Figure 3:
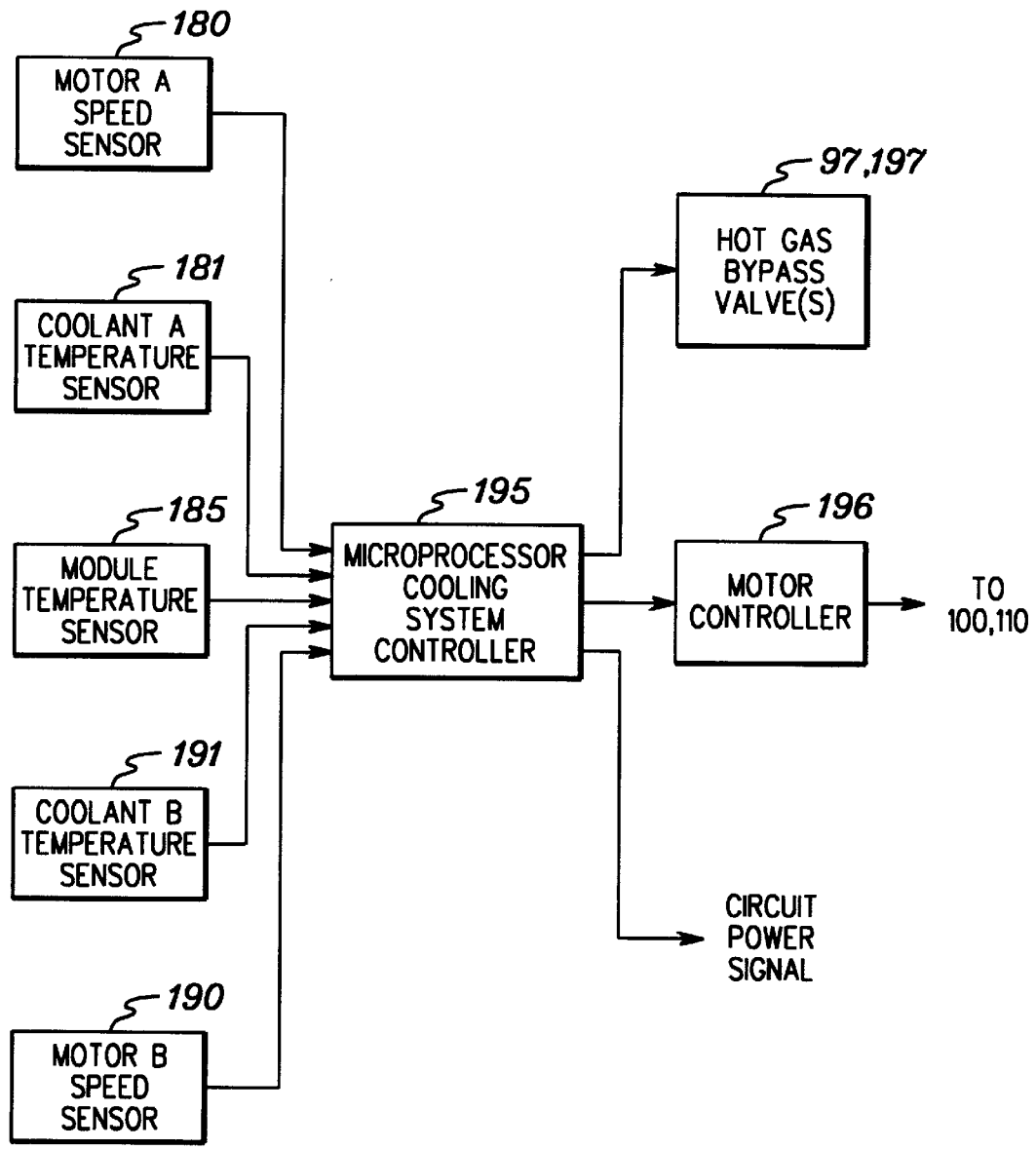
FIG. 3 is a block diagram illustrating a control system for operation of the redundant system shown in FIG. 2.

In those circumstances where the design of the refrigerant portions of the cooling system is such that both systems are required during normal operation, one must consider the possibility of the proper course of action to follow in the event that one of the refrigeration systems fails. Clearly, soft failure modalities are preferred. In order to effectuate such control, certain instrumentation readings are preferably provided to microprocessor cooling system controller 195, as shown in FIG. 3. Controller 195 has, as its principal design object, control of the temperature of module 151 and/or cold plate 150. In particular, desirable inputs for the cooling system controller include speed sensor 180 for motor A, speed sensor 190 for motor B, coolant temperature sensor 181 for circuit A, coolant temperature sensor 191 for circuit B and module temperature sensor 185 for module 151 and/or cold plate 150. Temperature sensors 181 and 191 are placed at the compressor exhaust and are used primarily for diagnostic purposes. Based upon these signal inputs, cooling system controller 195 provides signals to motor controller 196 to turn on either or both of motors 100 and 110 in FIG. 2.

Additionally, cooling system controller 195 may provide a "circuit power signal" which is provided as input to electronics processor module 151 as a signal that there is a cooling system problem and that the module should be operated at reduced power levels, say for example, by causing a reduction in the clock speed. In this manner, a solution to the cooling system problem including refrigerant or refrigeration system replacement may be effected while at the same time maintaining computer center operations although at a reduced pace and at a concomitantly reduced thermal load. Furthermore, in normal modes of operation, microprocessor controller 195 also controls HGBVs 97 and 197, as discussed above. Microprocessor controller 195 may comprise a processor unit dedicated to control purposes or, in fact, the functions of microprocessor 195 may be provided by programming code running within computer processor modules which are cooled by the refrigeration system herein and more particularly by programming running within microcoded portions of such a computer processor.

The redundant cooling system, shown in FIG. 2, is also employable in those situations where more than one electronics module is to be cooled. In these circumstances, each module is provided with its own cold plate and with its own expansion device. This situation is described further in the above-incorporated U.S. patents.

Figure 4:
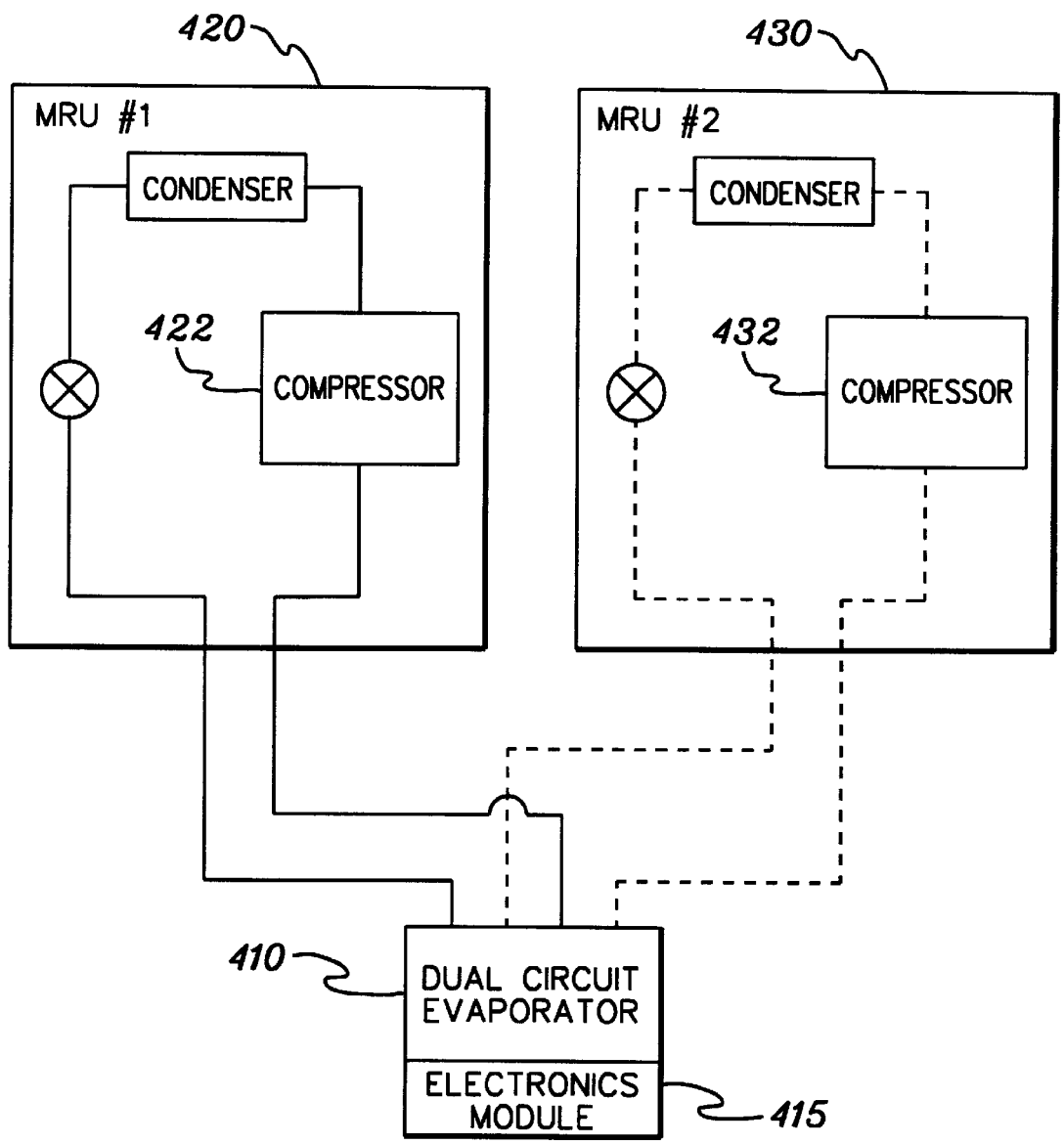
FIG. 4 is a simplified diagram illustrating an arrangement of components in one embodiment of a redundant refrigeration cooling system in accordance with the present invention.

As noted briefly above, one aspect of designing a cooling system for an electronics module such as described above is to ensure that various failure modalities do not bring the entire processing system down, nor risk damage to the components within the system. FIG. 4 depicts a simplified schematic of a redundant cooling system employing a dual circuit evaporator 410 disposed above an electronics module 415. Electronics module 415 may comprise any type of electronics or processing system, including unpackaged and packaged integrated circuit chips, such as single integrated circuit chip structures and multichip structures.

System 400 further includes two modular refrigeration units (MRUs) 420 and 430 as shown, and described in greater detail in the above-incorporated U.S. Pat. Nos. 5,954,127 and 5,970,731. Each MRU 420, 430 is connected to a separate and independent flow circuit within the common evaporator cold plate 410. Under normal operating conditions, one MRU may be on with refrigerant passing through the flow circuit connecting into the cold plate. If a refrigeration failure occurs (e.g., there is a compressor 422 or 432 failure, or a refrigerant leak), the currently operating cooling unit may be turned off and the second unit switched on.

Figure 6:
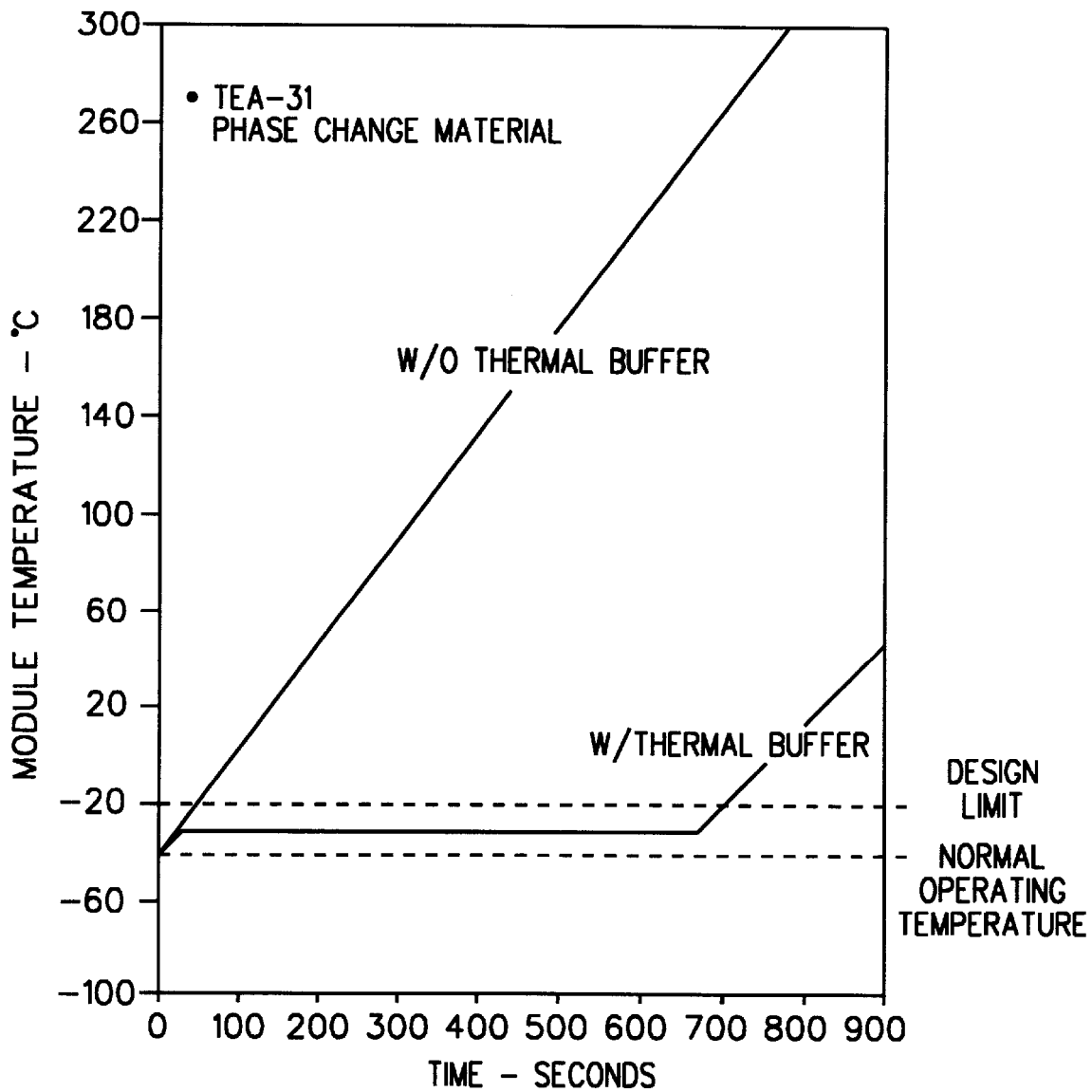
FIG. 6 graphically illustrates an example of electronics module temperature versus time responsive to refrigerant shut off or switching of refrigerant from a primary cooling system to a secondary system, both without the use of a thermal buffer unit, and with the use of a thermal buffer unit in accordance with the principles of the present invention.

During switchover, a certain amount of time is required for the second refrigeration unit to come up to full capacity and restore cooling to the condition that existed prior to the failure. During this period of time, the circuit temperatures within the electronics processor module may rise above their normal operating temperatures, particularly if there is no step down in power to those circuits as described above. Currently, the time to make a cooling switchover and come up to full capacity is short enough so that the transient rise that occurs in circuit temperatures is acceptable. However, as systems are designed to operate at lower and lower temperatures, the switchover time may be expected to increase (e.g., to 10–15 minutes), resulting in an unacceptable rise in circuit temperatures as illustrated in FIG. 6 and discussed below.

Thus, in one aspect, a thermal buffer unit is presented herein which utilizes a phase change material for thermal energy absorption and mitigation of temperature rise experienced by electronics circuits during shut down or changeover of cooling units, thereby allowing the processing system to continue to function while riding through, e.g., a refrigeration coolant switchover.

Figure 5A:
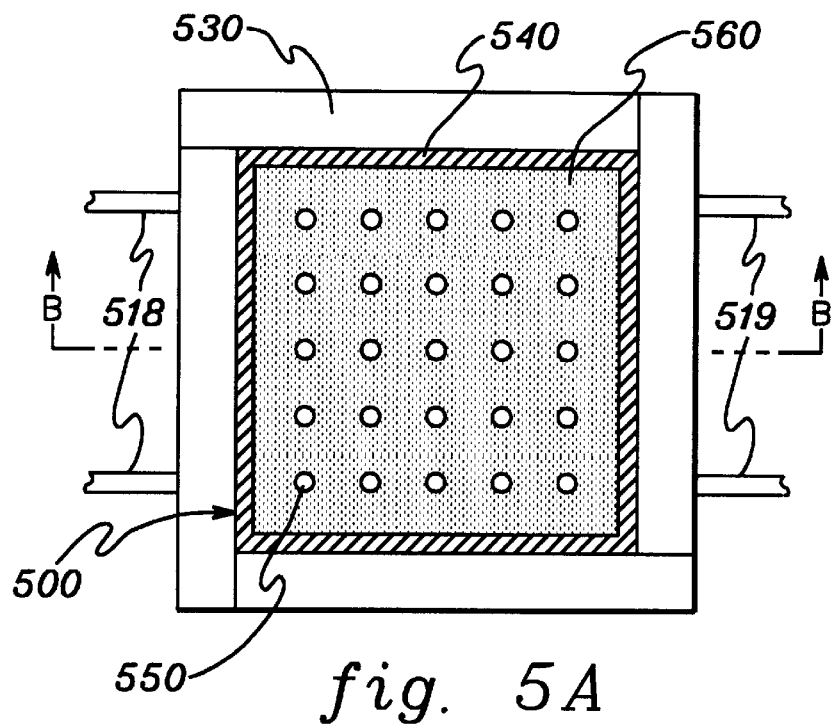
FIG. 5A is a cross-sectional plan view taken along line A—A of FIG. 5B showing one embodiment of an electronics module and a cooling system with a thermal buffer unit in accordance with the principles of the present invention.
Figure 5B:
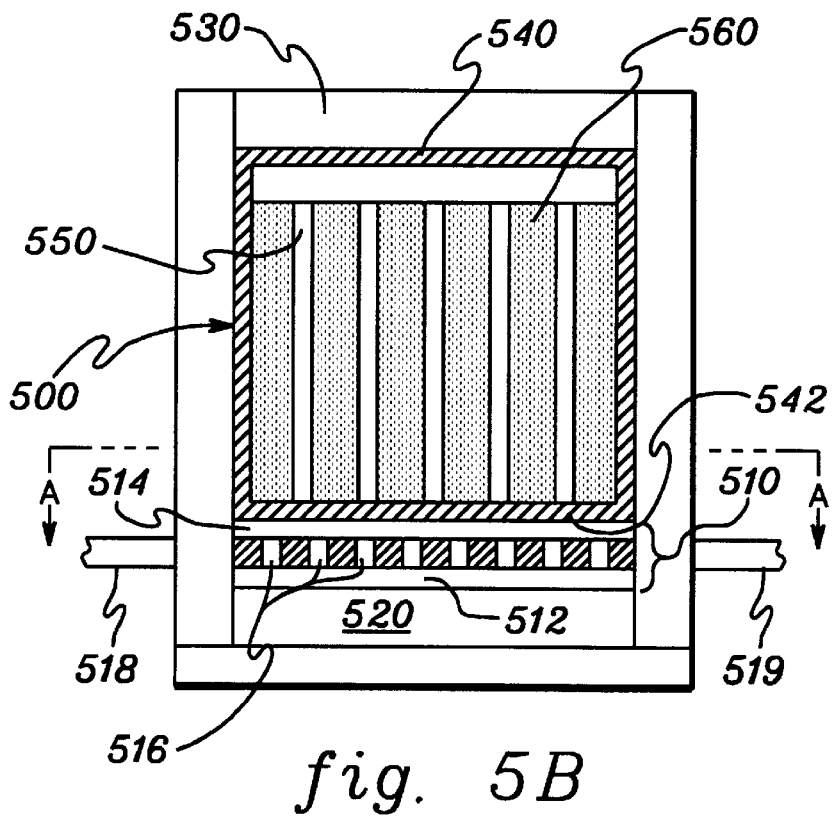
FIG. 5B is a cross-sectional elevational view of the cooling system and module assembly of FIG. 5A, taken along line B—B thereof, showing the thermal buffer unit disposed above a cold plate evaporator, which is disposed atop the electronics module.

One embodiment of a thermal buffer unit 500 in accordance with the principles of the present invention is shown in FIGS. 5A & 5B as part of a cooled processing stack. In this embodiment, thermal buffer unit 500 is attached to a main surface of an evaporator cold plate 510, which comprises a bottom plate 512 and a top plate 514 between which evaporator ribs or fins 516 are sandwiched. Multiple inlet and outlet ports 518 & 519 are depicted to provide coolant to the cold plate evaporator from, for example, a first modular refrigeration unit and/or a second modular refrigeration unit (see FIG. 4). Thermally coupled to plate 512 of evaporator cold plate 510 is, for example, an electronics module 520 to be cooled.

The thermal buffer unit 500 includes a containment chamber 540 having a base 542 from which project an array of thermal transfer rods 550. Transfer rods 550 are surrounded by a suitable phase change material 560. Under operating conditions, the entire assembly including electronics module 520, evaporator cold plate 510, and thermal buffer unit 500 will typically be at temperatures below the room temperature dew point. The entire assembly is therefore surrounded by a thermal insulation 530 to prevent condensation of water vapor on the exposed surfaces.

During normal operation, refrigerant flows through the cold plate evaporator providing the necessary cooling for the electronics module. In addition, the evaporator will also absorb heat from both the phase change material and the thermal transfer rods within the containment chamber. The array of thermal transfer rods, e.g., made of copper or other metal, may be provided within the containment chamber to facilitate the transfer of heat from the surrounding phase change material to the evaporator cold plate. While heat is extracted from the thermal buffer unit at a substantially lesser rate than from the electronics module, the temperature of the phase change material and the thermal transfer rods will eventually drop to that of the electronics module.

If a failure or shut off of the cooling unit occurs, interrupting the flow of refrigerant into the evaporator, heat from the electronics module can no longer be carried away by the refrigerant. Without the thermal buffer unit in place, the power dissipated by the module must be absorbed by the thermal capacitance of the module and evaporator assembly according to the differential equation $Q = M*C* (dT/dt)$, which will result in a continuous rise in module temperature until active cooling is restored. (In the differential equation, Q is a measure of heat, M is the effective mass of the assembly, C is the effective thermal capacity of the assembly, and dT/dt is the rate of change of temperature with respect to time.) With the thermal buffer unit in place, however, only some of the power dissipated by the module will be absorbed by the thermal capacitance of the module/evaporator assembly. The remainder will be transferred to the thermal buffer unit by means of thermal conduction across the internal ribs/fins within the evaporator cold plate. A certain amount of this heat will be absorbed by the thermal transfer rods by virtue of their thermal capacitance and the remainder will be conducted along the thermal transfer rods and into the phase change material. As the phase change material heats up, it will reach its transition or melting point temperature. When this occurs, the phase change material will begin to melt and absorb even more heat by virtue of its heat of fusion. During the period of time that the phase change material melts, the temperature will remain nearly constant at the melting point temperature. Once all the phase change material is melted, the heat dissipated by the module will again be absorbed by the thermal capacitance of the overall assembly (including the thermal buffer unit) resulting in a nearly linear temperature increase with time. Once refrigeration cooling is restored by powering up, for example, the redundant modular refrigeration unit, the module and thermal buffer unit will begin to cool down. As this happens, the phase change material will re-solidify and the heat which is released will be conducted via the thermal transfer rods to the evaporator cold plate where it will be removed by the flowing refrigerant.

Estimates of a modular temperature response following a refrigeration cooling failure for a typical design are shown in FIG. 6. For the examples shown, the normal module operating temperature is assumed to be −40° C. with a design limit of −20° C. for satisfactory circuit operation. As can be seen, without a thermal buffer unit, the module temperature rises continuously following a cooling failure. With the use of a thermal buffer unit, however, module temperature begins to rise until the transition temperature (i.e., melting point) of the phase change material in the buffer is reached. In this instance, the phase change material is assumed to be TEA-31 (which is available through MJM Engineering Company of Naperville, Ill.), with a melting point of −31° C. Once the phase change material begins to melt, the temperature remains nearly constant until all the material is melted, e.g., at about ten minutes after the refrigeration failure has occurred, thereby allowing time to bring the redundant MRU up without interrupting operation of the computer. Without the thermal buffer unit temperatures in excess of the assumed −20° C. design limit would be experienced in less than a minute resulting in a shut down of the processing system and down time for the customer.

Application of a thermal buffer unit utilizing a phase change material is not restricted to the temperatures used in the preceding example. The TEA phase change material assumed in the example is available in a range of melting point temperatures from, for example, −31° C. to 10° C. (For example TEA-4, TEA-10, TEA-16 and TEA-21 are all phase change materials available through MJM Engineering Company.) Alternatively, water/ice could also be used as a phase change material in the thermal buffer unit. With the addition of an appropriate concentration of antifreeze (e.g., ethylene glycol), any freezing/melting temperature from −40° C. to 0° C. could readily be obtained.

Figure 7A:
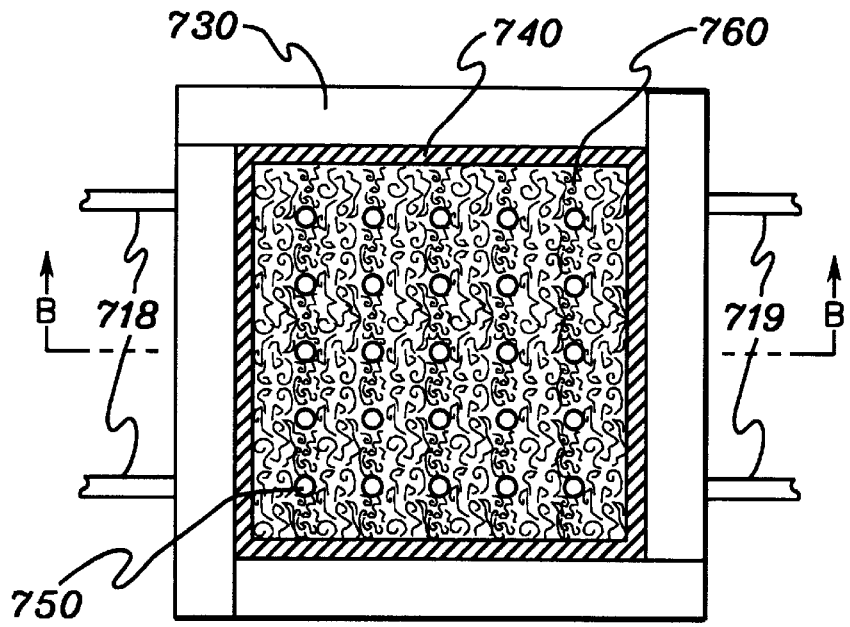
FIG. 7A is a cross-sectional plan view taken along line A—A of FIG. 7B showing an alternate embodiment of an electronics module and cooling system with a thermal buffer unit in accordance with the principles of the present invention.
Figure 7B:
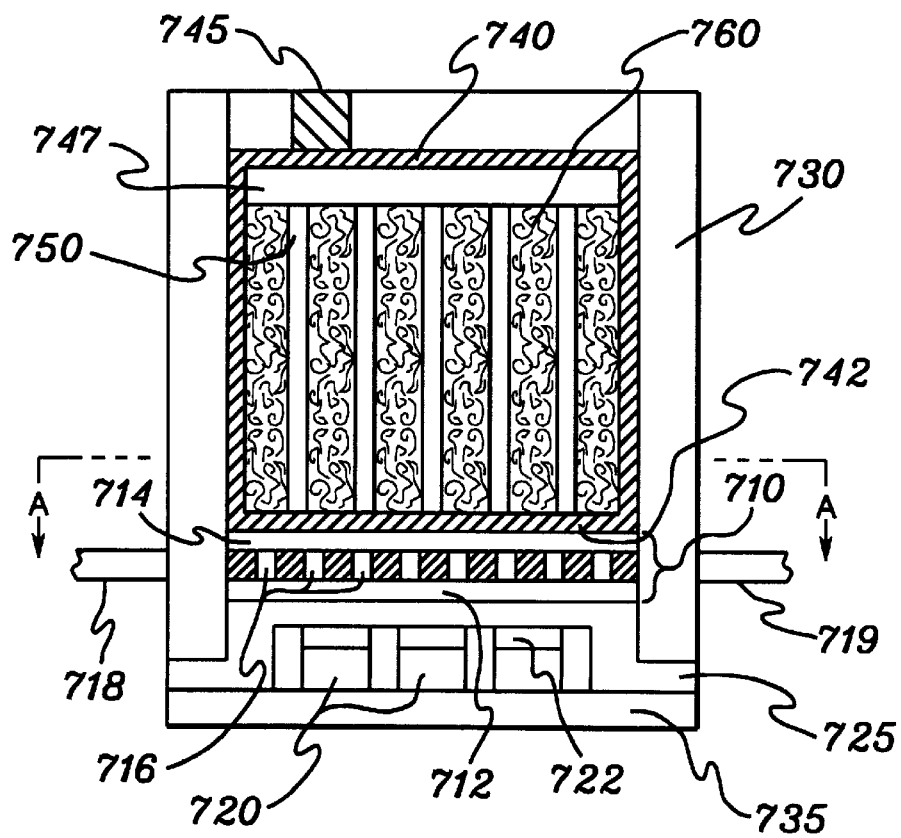
FIG. 7B is a cross-sectional elevational view of the cooling system and module assembly of FIG. 7A, taken along line B—B thereof, showing the thermal buffer unit disposed above the cold plate evaporator, which is disposed above the electronics module (which in this case comprises multiple integrated circuit chips)

An alternate embodiment of a thermal buffer unit 700 in accordance with the principles of the present invention is shown in FIGS. 7A & 7B, again as part of a cooled processing stack. In this embodiment, thermal buffer unit 700 is attached to a main surface of an evaporator cold plate 710, which comprises a bottom plate 712 and a top plate 714 between which evaporator ribs or fins 716 are sandwiched. Multiple inlet and outlet ports 718 & 719, respectively, are depicted to provide coolant to the cold plate evaporator from, for example, a first modular refrigeration unit and/or a second modular refrigeration unit (see FIG. 4). Thermally coupled to plate 712 of evaporator cold plate 710 is, in this example, a multichip electronics module which includes a substrate 735, multiple integrated circuit chips 720 disposed thereon and a thermally conductive cap 725 encapsulating the chips. As one embodiment, a thermal grease 722 may be employed to facilitate heat transfer from the integrated circuit chips 720 to cap 725, and hence to evaporator cold plate 710.

Thermal buffer unit 700 includes a containment chamber 740 having a base 742 from which project an array of thermal transfer rods 750. In this embodiment, transfer rods 750 are surrounded by a metal foam material 760, such as the Duocel® aluminum foam metal marketed by ERG Materials and Aerospace Corporation of Oakland, Calif. This material exhibits a continuously connected, open celled (reticulated) geometry having a duodecahedronal cell shape. The metal foam is available in a density range of 3%–50% to the solid base metal, and a cell density of 5, 10, 20 and 40 pores per linear inch, with material density and cell size independently variable. The foam's density, cell size, alloy and ligament structure can be tailored to meet the response characteristics of a specific application. Within the pores of the metal foam structure is a suitable phase change material. The phase change material may be added to the containment chamber 740 via a fill port/plug 745. Ideally, an expansion space 747 is provided at an upper portion of the containment chamber.

In operation, the metal foam structure provides a distributed network of thermal conduction paths from the thermal transfer rods into the surrounding phase change material within the containment chamber. If desired, the metal foam structure and phase change material could be employed alone without the use of thermal transfer rods. However, enhanced heat transfer from the base of the phase change containment chamber throughout the overall mass of phase change material is believed provided by the use of the thermal transfer rods. Any phase change material, such as described above in connection with FIGS. 5A & 5B, could be employed with this embodiment of the thermal buffer unit. Operation of the buffer unit would be as described above in connection with FIGS. 5A & 5B.

Figure 8:
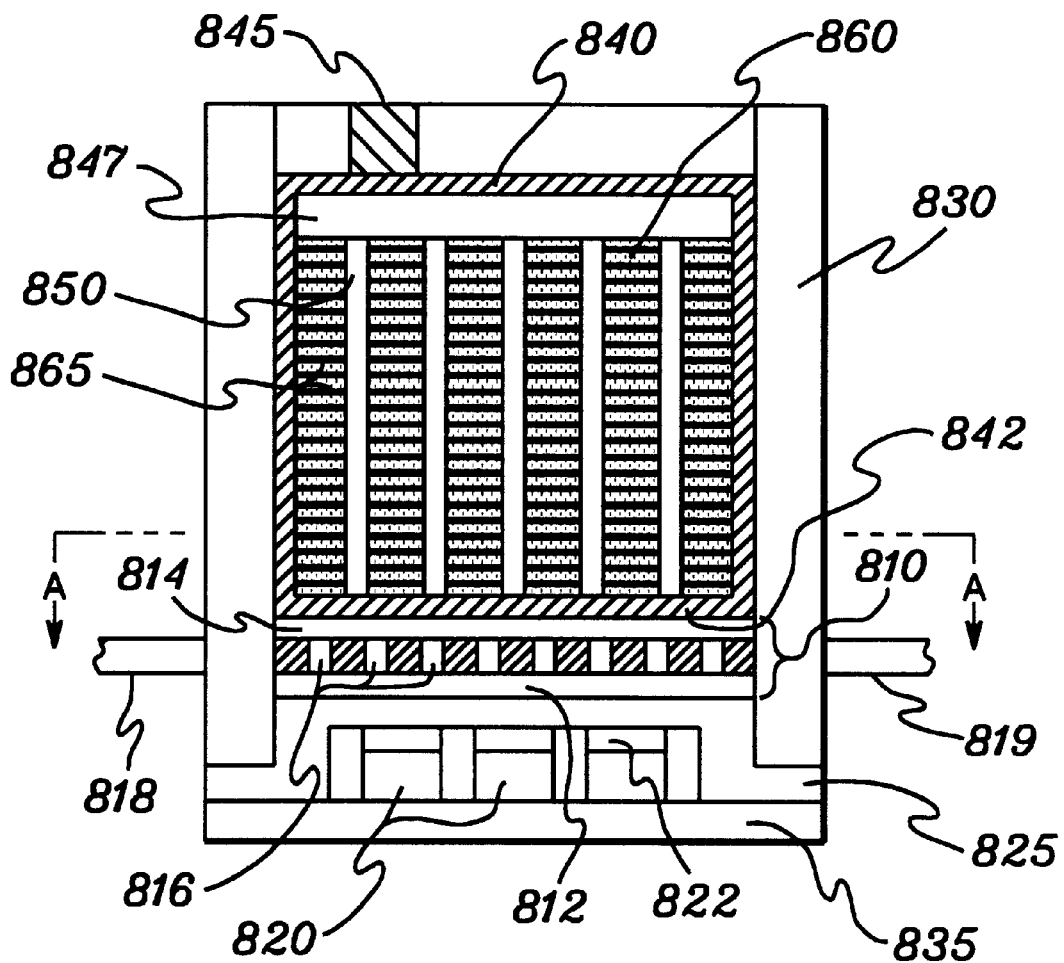
FIG. 8 is a cross-sectional elevational view of an alternate embodiment of a cooling system and module assembly in accordance with the present invention showing a thermal buffer unit having plate fins and a phase change material disposed above the electronics module (which in this case again comprises multiple integrated circuit chips).

Still another embodiment of a thermal buffer unit in accordance with the principles of the present invention is depicted in FIG. 8, again as part of a cooled processing stack. In this embodiment, the thermal buffer unit is attached to a main surface of an evaporator cold plate 810, which comprises a bottom plate 812 and a top plate 814 between which evaporator ribs or fins 816 are sandwiched. Multiple inlet and outlet ports 818 and 819, respectively, would be provided to supply coolant to the cold plate evaporator from, for example, a first modular refrigeration unit and/or a second modular refrigeration unit (see FIG. 4). Thermally coupled to plate 812 of evaporator cold plate 810 is a multichip electronics module which includes a substrate 835, multiple integrated circuit chips 820 disposed thereon and a thermally conductive cap 825 encapsulating the chips. In this embodiment, a thermal grease 822 is employed to facilitate heat transfer from the integrated circuit chips 820 to cap 825, and hence to evaporator cold plate 810.

The thermal buffer unit includes a containment chamber 840 having a base 842 from which projects an array of thermal transfer rods 850. In this embodiment, transfer rods 850 are surrounded by a plurality of stacked and spaced plate fins 865 between which a phase change material 860 resides. Plate fins 865 may be thermally attached to thermal transfer rods 850 in a variety of ways. For example, plates 865 could be stamped with holes appropriate to fit over the transfer rods after which thermal contacts can be made, for example, by soldering. Additional openings may be provided in the plates to allow for movement of the phase change material when in liquid form between the plates, as well as to facilitate filling of the chamber. The phase change material may be added to the containment chamber 840 via a fill port/plug 845. Ideally, an expansion space 847 is provided in an upper portion of the containment chamber. Thermal insulation 830 can be provided over the assembly to inhibit the formation of condensation on one or more surfaces thereof.

The operation of the thermal buffer unit would be essentially as described above in connection with FIGS. 5A, 5B & 7A, 7B. The plate fins 865 again provide a distributed network of thermal conduction paths extending through the thermal transfer rods down to the base of the containment chamber. Note that any phase change material, such as described above in connection with FIGS. 5A & 5B, could be employed in this embodiment of the thermal buffer unit.

Although preferred embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. A cooling system comprising:
   a cooling unit;
   an evaporator plate having at least one isolated refrigerant loop therein for receiving coolant from the cooling unit; and
   a thermal buffer, said thermal buffer being thermally coupled to the evaporator plate to maintain temperature of the evaporator plate within a predefined range for a period of time upon shut down or failure of the cooling unit.

2. The cooling system of claim 1, wherein the thermal buffer comprises a thermal buffer unit thermally coupled to a main surface of the evaporator plate.

3. The cooling system of claim 2, wherein the thermal buffer unit includes a chamber having a phase change material disposed therein, wherein the phase change material maintains temperature of the thermal buffer unit substantially constant within the predefined range for the period of time notwithstanding shut down or failure of the cooling unit.

4. The cooling system of claim 3, further comprising a thermal conductor structure disposed within the chamber of the thermal buffer unit, wherein the phase change material at least partially surrounds the thermal conductor structure, and the thermal conductor structure facilitates heat transfer between said evaporator plate and said phase change material.

5. The cooling system of claim 4, wherein the thermal conductor structure comprises at least one of a metal foam structure, one or more thermal transfer rods, one or more heat pipes or one or more plate fins thermally coupled to a base of the thermal buffer unit, wherein said base of the thermal buffer unit is thermally coupled to said main surface of the evaporator plate.

6. The cooling system of claim 5, wherein the thermal conductor structure comprises said metal foam structure, and wherein said phase change material resides within pores in said metal foam structure.

7. The cooling system of claim 1, wherein said cooling unit comprises a first cooling unit, and wherein said system further comprises a second cooling unit, and the evaporator plate has at least two isolated refrigerant loops therein, each isolated refrigerant loop receiving coolant from a respective one of the first cooling unit and the second cooling unit; and wherein said thermal buffer is sized to maintain temperature of the evaporator plate within said predefined range for said period of time upon shut down or failure of one of the first cooling unit or the second cooling unit, or upon switching cooling responsibility to the evaporator plate between the first cooling unit and the second cooling unit.

8. The cooling system of claim 7, wherein said thermal buffer comprises a thermal buffer unit including a chamber having a phase change material disposed therein, wherein the phase change material maintains temperature of the thermal buffer unit substantially constant within the predefined range for the period of time notwithstanding shut down or failure of said one cooling unit or switching of cooling between the first cooling unit and the second cooling unit, and wherein the thermal buffer unit further comprises a thermal conductor structure disposed within the chamber of the thermal buffer unit, said thermal conductor structure facilitating heat transfer between said evaporator plate and said phase change material.

9. The cooling system of claim 8, wherein the evaporator plate is thermally coupled to an electronics module, and wherein the thermal buffer unit is sized to allow said electronics module to remain operational without lowering power thereto upon switching cooling responsibilities to the evaporator plate between the first cooling unit and the second cooling unit.

10. The cooling system of claim 9, further comprising a thermal insulation layer disposed about the chamber of the thermal buffer unit, the evaporator plate and the electronics module for preventing condensation from forming on exposed surfaces thereof.

11. A cooled processing stack comprising:
    an electronics module having a main surface;
    a cooling system thermally coupled to the main surface of the electronics module, said cooling system comprising:
      a cooling unit;
      an evaporator plate having at least one isolated refrigerant loop therein for receiving coolant from the cooling unit; and
      a thermal buffer, said thermal buffer being thermally coupled to the evaporator plate to maintain temperature of the evaporator plate within a predefined range for a period of time upon shut down or failure of the cooling unit.

12. The cooled processing stack of claim 11, wherein the thermal buffer comprises a thermal buffer unit having a chamber with a phase change material disposed therein, wherein the phase change material maintains temperature of the thermal buffer unit substantially constant within the predefined range for the period of time notwithstanding shut down or failure of the cooling unit.

13. The cooled processing stack of claim 12, further comprising a thermal conductor structure disposed within the chamber of the thermal buffer unit, said thermal conductor structure facilitating heat transfer between said evaporator plate and said phase change material.

14. The cooled processing stack of claim 13, wherein the thermal conductor structure comprises at least one of a metal foam structure, one or more thermal transfer rods, one or more heat pipes, or one or more plate fins thermally coupled to a base of the thermal buffer unit, wherein said base of the thermal buffer unit is thermally coupled to said main surface of the evaporator plate.

15. The cooled processing stack of claim 14, wherein the thermal conductor structure comprises said metal foam structure and a plurality of thermal transfer rods.

16. A method of fabricating a cooling system for an electronics module, said method comprising:
    providing a refrigeration cooled cold plate;
    thermally coupling a thermal buffer unit to said refrigeration cooled cold plate; and
    thermally coupling said refrigeration cooled cold plate to said electronics module for removing heat generated by the electronics module, wherein said thermal buffer unit is thermally coupled to said electronics module across said refrigeration cooled cold plate for auxiliary cooling of said electronics module upon shut down or failure of said refrigeration cooled cold plate.

17. The method of claim 16, further comprising providing the thermal buffer unit with a chamber and a phase change material disposed therein, wherein the phase change material maintains temperature of the thermal buffer unit substantially constant within the predefined range for the period of time notwithstanding shut down or failure of the cooling unit.

18. The method of claim 17, wherein said providing the thermal buffer unit further comprises providing the thermal buffer unit with a thermal conductor structure disposed within the chamber thereof, wherein the thermal conductor structure facilitates heat transfer between the evaporator plate and the phase change material.

19. The method of claim 18, wherein said providing the thermal buffer unit further comprises providing the thermal buffer unit with a thermal conductor structure which comprises at least one of a metal foam structure, one or more thermal transfer rods, one or more heat pipes, or one or more plate fins thermally coupled to a base of the thermal buffer unit, wherein the base of the thermal buffer unit is thermally coupled to a main surface of the evaporator plate.

20. The method of claim 16, wherein said providing the refrigeration cooled cold plate comprises providing the refrigeration cooled cold plate with at least two isolated passageways for accommodating circulation fluid from two separate refrigeration systems such that said cooling system comprises multiple independent cooling subsystems, said multiple independent cooling subsystems comprising said two separate refrigeration systems.

21. The method of claim 20, further comprising sizing said thermal buffer unit to allow switching of said refrigeration cooled cold plate between said multiple independent cooling subsystems without requiring reduction in power to or shutting off of the electronics module.

* * * * *